United States Patent

Nagai et al.

[11] Patent Number: 6,106,933
[45] Date of Patent: Aug. 22, 2000

[54] TRANSPARENT GAS BARRIER BIAXIALLY ORIENTED POLYPROPYLENE FILM, A LAMINATE FILM, AND A PRODUCTION METHOD THEREOF

[75] Inventors: Itsuo Nagai; Shigeru Tanaka; Masayoshi Asakura, all of Shiga, Japan

[73] Assignee: Toray Industries, Inc., Japan

[21] Appl. No.: 09/053,330

[22] Filed: Apr. 1, 1998

[30] Foreign Application Priority Data

Apr. 3, 1997 [JP] Japan .................................... 9-085057

[51] Int. Cl.[7] .............................. B32B 15/08; B32B 27/32
[52] U.S. Cl. .......................... 428/212; 428/461; 428/516; 428/702; 428/409; 427/255.31
[58] Field of Search ..................... 428/461, 515, 428/516, 212, 702, 409, 35.9; 427/255.31

[56] References Cited

U.S. PATENT DOCUMENTS

| | | | |
|---|---|---|---|
| 4,345,005 | 8/1982 | All et al. | 428/461 |
| 4,364,995 | 12/1982 | Crawford et al. | 428/336 |
| 4,430,366 | 2/1984 | Crawford et al. | 427/162 |
| 5,399,842 | 3/1995 | Watanabe et al. | 219/730 |

FOREIGN PATENT DOCUMENTS

| | | |
|---|---|---|
| 62-101428 | 5/1987 | Japan . |
| 6-328612 | 11/1994 | Japan . |
| 60-2337 | 2/1995 | Japan . |

*Primary Examiner*—Paul Thibodeau
*Assistant Examiner*—D. Lawrence Tarazano
*Attorney, Agent, or Firm*—Austin R. Miller

[57] ABSTRACT

A transparent gas barrier biaxially oriented polypropylene film, comprising a base layer mainly composed of a polypropylene polymer, a polyolefin resin layer of 30 to 85 J/g in the heat of fusion formed at least on one side of the base layer, and an imperfectly oxidized alumina layer formed on the polyolefin resin layer, wherein the aluminum metal concentration in the internal portion of the imperfectly oxidized alumina layer is higher than that in the surface of the layer and that in the interface with the polyolefin resin layer, and the aluminum metal content of the imperfectly oxidized alumina layer is kept in a range of 10 to 200% nm. It is a transparent metallized gas barrier biaxially oriented polypropylene film excellent in moisture and oxygen barrier properties and also excellent in the gas barrier properties after elongation.

11 Claims, 1 Drawing Sheet

TRANSPARENT GAS BARRIER BIAXIALLY ORIENTED POLYPROPYLENE FILM, A LAMINATE FILM, AND A PRODUCTION METHOD THEREOF

BACKGROUND OF THE INVENTION

1. Field of the Invention

The present invention relates to a gas barrier biaxially oriented polypropylene film for packaging excellent in transparency and moisture and oxygen barrier properties and also in the gas barrier properties after elongation, a laminate film, and a production method thereof.

2. Description of the Related Arts

Biaxially oriented polypropylene films have been widely used for packaging, since they are excellent in clarity, mechanical properties, moisture barrier property, etc. Furthermore, biaxially oriented polypropylene films coated with polyvinylidene chloride for further improving gas barrier properties and moisture barrier property are widely used as a transparent packaging material excellent in gas barrier properties. However, polyvinylidene chloride generates chlorine based gases when incinerated as waste, and is feared to adversely affect the environment. To solve this problem, films with a metal oxide vapor-deposited on them have been developed as packaging films. For example, Japanese Patent Publication (Kokoku) No. 53-12953 discloses a plastic film with silicon oxide deposited.

Furthermore, Japanese Patent Laid-Open (Kokai) No. 4-20383 discloses a plastic film with a thin amorphous aluminum oxide layer formed on it. However, the aluminum oxide layer is a substantially perfectly oxidized alumina layer, and if a biaxially oriented polypropylene film is used as a substrate for it, gas barrier properties are insufficient.

On the other hand, Japanese Patent Laid-Open (Kokai) No. 62-220330 discloses an anti-static gas barrier film in which a gas barrier layer made of imperfectly oxidized alumina containing 1 to 15 wt % of aluminum is formed on a transparent plastic substrate. However, since the distribution of aluminum metal in the vapor-deposited layer is not taken into account at all, and high gas barrier properties with a biaxially oriented polypropylene film as the substrate are not obtained.

Japanese Patent Laid-Open (Kokai) No. 5-338072 discloses a transparent gas barrier film with an imperfectly oxidized alumina layer formed on a polymer resin film such as a polyethylene terephthalate film. However, since the imperfectly oxidized alumina layer is highly oxidized, the aluminum metal content is low, and no polyolefin resin layer is formed on one side of the substrate. So, high gas barrier properties cannot be obtained.

EP-A-0437946 discloses a packaging material with a coating layer made of a uniform mixture consisting of aluminum metal and its oxide on a web substrate. However, since the aluminum metal is uniformly distributed in the imperfectly oxidized alumina layer, a film with high gas barrier properties cannot be obtained.

Even if these techniques are applied to a polypropylene film used as a substrate, the vapor-deposited layer is destroyed by elongation to greatly lower the gas barrier properties when the film is further laminated or printed for processing into a packaging material because the Young's modulus of the polypropylene film is low and because the vapor-deposited layer is poor in ductility.

As optical films and production processes thereof, U.S. Pat. Nos. 4,364,995 and 4,430,366 disclose films in which the contents of a metal and a metal oxide continuously change in the film thickness direction, and also production processes thereof. The object of the technique is to continuously produce a thin metal layer and a metal oxide layer, and the film has a thin metal layer on one side in the film thickness direction and a perfect metal oxide film on the other side. So, the film is opaque and is not transparent, not being able to be used for any application requiring transparency, hence limited in application disadvantageously.

U.S. Pat. No. 4,345,005 discloses forming an ethylene-propylene copolymer layer on the surface of a biaxially oriented polypropylene film, and evaporating aluminum on it, to improve the adhesiveness of the vapor-deposited aluminum layer. However, the film is opaque and cannot be used for any application requiring transparency.

SUMMARY OF THE INVENTION

The object of the present invention is to provide a gas barrier biaxially oriented polypropylene film having the transparency and high gas barrier properties which cannot be achieved by the prior art, and also keeping the gas barrier properties even after elongation, and also to provide a laminate film.

The inventors studied the problem, and as a result, found that the gas barrier properties derived from a film formation of a practically transparent imperfectly oxidized alumina layer on a biaxially oriented polypropylene film mainly composed of a polypropylene polymer are significantly affected by the properties of the polyolefin resin layer formed on the surface of the biaxially oriented polypropylene film and the structure of the imperfectly oxidized alumina layer.

The transparent gas barrier biaxially oriented polypropylene film of the present invention comprises a base layer mainly composed of a polypropylene polymer, a polyolefin resin layer of 30 to 85 J/g in the heat of fusion formed at least on one side of the base layer, and an imperfectly oxidized alumina layer formed on the polyolefin resin layer, wherein the aluminum metal concentration in the internal portion of the imperfectly oxidized alumina layer is higher than that in the surface of the layer and that in the interface with the polyolefin resin layer, and the aluminum metal content in the imperfectly oxidized alumina layer is kept in a range of 10 to 200% nm.

In this case, it is preferable that aluminum metal is distributed only in the internal portion of the imperfectly oxidized alumina layer.

One embodiment of the laminate film of the present invention comprises a biaxially oriented polypropylene film composed of a polypropylene polymer, being bonded on said transparent gas barrier biaxially oriented polypropylene film on the imperfectly oxidized alumina layer side, through an adhesive or polyolefin resin.

A preferable embodiment of the method for producing a transparent gas barrier biaxially oriented polypropylene film, in which an imperfectly oxidized alumina layer is continuously formed on a polyolefin resin substrate consisting of a base layer mainly composed of a polypropylene polymer and a polyolefin resin layer of 30 to 85 J/g in the heat of fusion formed at least on one side of the base layer, by reactively evaporating metal aluminum with an oxidizing gas, comprises the steps of introducing the oxidizing gas below the substrate with its distance from the substrate kept at ¼ or less of the distance between the evaporation source and the substrate, from the side where the substrate goes into the area for receiving the evaporated aluminum, with the concentration of the oxidizing gas changed in the progression direction of the substrate, to change the concentration of aluminum metal vapor-deposited in the thickness direction of the vapor-deposited layer; and exposing the imperfectly oxidized alumina layer to atmospheric air, for aging.

DETAILED DESCRIPTION OF THE INVENTION

Figure 1:
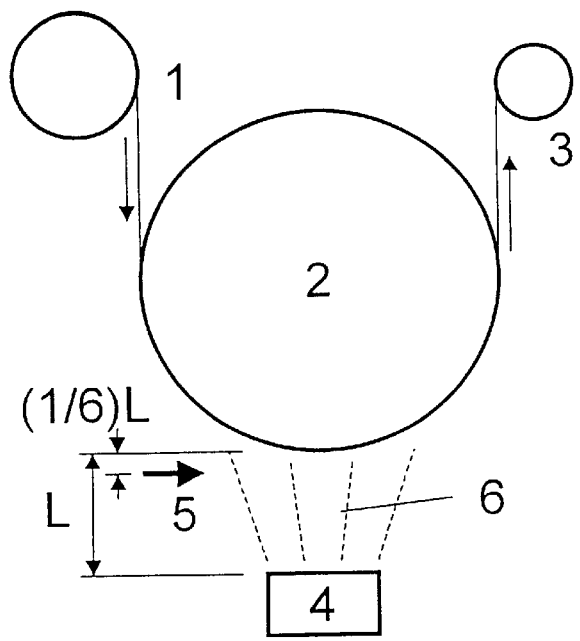
FIG. 1 is a schematic drawing showing the evaporator used in the examples of the present invention. Oxygen is introduced below the substrate from the side where the substrate is unwinded, and the distance between the oxygen introducing position and the substrate is ⅙ of the distance between the evaporation source and the substrate.

It is preferable that the polypropylene polymer used in the base layer mainly composed of a polypropylene polymer in the present invention is polypropylene homopolymer or a polypropylene copolymer containing 10 wt % or less, preferably 6 wt % or less, more preferably 4 wt % or less of an α-olefin such as ethylene or butene-1 in view of heat resistance and mechanical strength. Crystalline isotactic polypropylene is especially preferable, and a polypropylene polymer with the isotactic index (II) kept in a range of 95 to 99% and the mesopentad fraction as a stereoregularity index kept in a range of 90 to 99.5% is preferable in view of both the mechanical properties and thermal stability of the obtained film and film formability. If either of the indexes is too low, the mechanical properties and thermal stability may decline, and if too high, crystallinity may become so high as to make film formation difficult. It is preferable in view of film formability that the melt flow index (MFI) of the polypropylene polymer is 2.5 to 6 g/10 min. In film production, it is desirable in view of cost reduction that the cut-off edges of the film are recycled for raw material of the base layer resin, and in this case, a mixture consisting of the cut-off edges and 15 wt % or less of the polyolefin resin used in the surface layer can also be used in the base layer.

The polyolefin resin used to form the surface layer in the present invention must be 30 to 85 J/g in the heat of fusion of the resin layer. If the heat of fusion is too large, the gas barrier properties after forming the imperfectly oxidized alumina layer may be poor. If the heat of fusion is too small, the polyolefin resin layer is likely to be cracked due to the heat applied when the imperfectly oxidized alumina layer is formed and/or when the film is processed into a package after the imperfectly oxidized alumina layer has been formed, and in this case, gas barrier properties are highly likely to decline. For the reasons mentioned above, it is more preferable that the heat of fusion of the resin forming the surface layer is 40 to 80 J/g. In the present invention, it is important to form a polyolefin resin layer as the surface layer. The heat of fusion of ordinary homo-polypropylene is about 100 J/g. If the resin layer formed as the surface layer is low in the heat of fusion as in the present invention, the heat of condensation generated when the vapor-deposited film is formed melts the very surface portion of the polyolefin resin layer, for improving the adhesiveness of the vapor-deposited film and gas barrier properties.

Preferable polyolefin resins which can be used to form the surface layer include polypropylene copolymers, syndiotactic polypropylene resin, ethylene-α-olefin copolymers, homopolymer resins such as low stereoregularity polypropylene resin, blend resins consisting of any of these resins and 50 wt % or less of isotactic polypropylene.

The polypropylene copolymers which can be used here are obtained by copolymerizing propylene monomer and 3 to 15 wt %, preferably 4 to 10 wt % of an α-olefin monomer such as ethylene or butene-1. It is preferable that the melting point of the polypropylene copolymer is 132 to 150° C., and in view of both gas barrier properties and machinability, a more preferable range is 135 to 145° C. Preferable polypropylene copolymers include ethylene-propylene copolymer, ethylene-propylene-butene terpolymer and propylene-butene copolymer. In view of film formability, it is preferable that the MFI of the polypropylene copolymer is 1 to 10 g/10 min, and a more preferable range is 2.5 to 10 g/10 min.

Syndiotactic polypropylene resin (hereinafter may be abbreviated as "syn-PP") is a polypropylene resin with highly syndiotactic stereoregularity obtained by using a metallocene catalyst. Its syndiotacticity should be 70% or more, preferably 75% or more. The syndiotactic polypropylene may contain 5 wt % or less of a comonomer such as ethylene or butene. The melting point of syndiotactic polypropylene depends on syndiotacticity, but should be 125 to 150° C. It is more preferable to blend 50 wt % or less of isotactic polypropylene, preferably a polypropylene copolymer of 145° C. or higher, with syndiotactic polypropylene, since the heat resistance of the resin forming the surface layer can be improved.

The ethylene-α-olefin copolymers refer to copolymers consisting of 70 to 90 wt % of ethylene and an α-olefin such as propylene, butene or hexene, and since these copolymers are low in softening point, it is preferable in view of heat resistance to blend 30 to 50 wt % of isotactic polypropylene, or preferably a polypropylene copolymer of 145° C. of melting point or higher.

A low stereoregularity polypropylene resin refers to a polypropylene resin low in the mesopentad fraction used as a stereoregularity index. The mesopentad fraction can be evaluated by $^{13}C$ NMR measurement. The mesopentad fraction of the low stereoregularity polypropylene resin suitable for the present invention is 60 to 90%. If the mesopentad fraction is too low, heat resistance may become poor, and if too high, gas barrier properties may become insufficient.

When a plurality of resins are blended as described above for use as the resin to form the surface layer and/or a block copolymer is used, the heat of fusion is defined as the sum of the heat values of fusion of the respective components.

The film of the present invention is obtained by biaxially stretching a cast film, and the biaxial stretching improves the mechanical strength and gas barrier properties compared to the cast film.

In the surface of the polyolefin resin layer of 30 to 85 J/g in the heat of fusion, it is preferable that the areal rate of surface portions with gradients of 30 degrees or more is 3% or less, since higher gas barrier properties can be manifested. A large reason why surface portions with gradients of 30 degrees or more are formed is as follows. In an ordinary sequential biaxial stretching process, the stretching in the transverse direction is followed by heat treatment at a temperature near the melting point of the resin mainly composed of a polypropylene polymer in the base layer and higher than the melting point of the polyolefin resin, and subsequently, the film is gradually cooled, causing the polyolefin resin layer to be crystallized. In this case, fine portions called fibrils appear to form said surface portions. The pitch and height of the fibrils may be about the same as the thickness of the imperfectly oxidized alumina layer formed later by evaporation, and if the layer is vapor-deposited onto the surface, the layer may not be able to be formed uniformly. The fine surface portions can be observed on an image obtained at a magnification of about 100,000 times by a scanning electron microscopy (SEM) or atomic force microscopy (AFM), etc. The areal rate of the sharp portions, i.e., surface portions with gradients of 30 degrees or more can be calculated by analyzing the image.

The transparent gas barrier biaxially oriented polypropylene film of the present invention basically consists of three layers; imperfectly oxidized alumina layer, surface layer and base layer. It is suitable for use as a packaging material, to further laminate a heat sealable resin on the polypropylene film on the side opposite to the base layer.

It is preferable for packaging that the total thickness of the surface layer and the base layer is 10 to 40 $\mu$m, and a more preferable range is 15 to 25 $\mu$m. It is preferable that the thickness of the surface layer is 0.2 to 2 $\mu$m. If the thickness is less than 0.2 $\mu$m, lamination is likely to cause roughening which may pose a problem in gas barrier properties and appearance. If the thickness exceeds 2 $\mu$m, the heat of condensation caused when the imperfectly oxidized alumina layer is formed may soften the surface layer, to roughen the surface.

It is preferable that the polyolefin resin layer formed as the surface layer in the present invention contains crosslinked polymer particles. The crosslinked polymer particles can be crosslinked polystyrene particles, crosslinked polymethyl methacrylate particles, or crosslinked silicone particles, etc. It is preferable that the form of the crosslinked polymer particles is almost spherical, and that the particle size is 0.5 to 4 $\mu$m, being selected in a range of 0.7 to 2 times the thickness of the surface layer, since anti-scratching property, lubrication and anti-blocking property can be obtained. The amount of the crosslinked polymer particles added is kept in a range of 0.05 to 0.5 wt %, for intended surface design.

It is preferable that the center line average surface roughness (Ra) of the polyolefin resin layer formed as the surface layer is in a range of 0.04 to 0.08 $\mu$m. If less than 0.04 $\mu$m, the lubrication of the film is poor, and when the film is wound and processed after the imperfectly oxidized alumina layer has been formed, the gas barrier properties are highly likely to be worsened probably because the vapor-deposited layer is destroyed. If more than 0.08 $\mu$m, the vapor-deposited layer is likely to be less uniform, and gas barrier properties may become poor.

In the present invention, it is preferable in view of the adhesiveness to the imperfectly oxidized alumina layer, that the surface of the polyolefin resin layer has the wetting tension kept in a range of 36 to 52 mN/m by using any of various surface treatment methods. If the wetting tension exceeds 52 mN/m, blocking may occur.

In the present invention, the base layer and the polyolefin resin layer may contain small amounts of a thermostabilizer and an antioxidant. For example, as the thermostabilizer, 0.5 wt % or less of 2,6-di-t-butyl-4-methylphenol, etc. may be added, and as the antioxidant, 0.1 wt % or less of tetrakis-[methylene-3-(3,5-di-t-butyl-4-hydroxyphenyl)propionate] methane("Irganox" 1010), etc. may be added.

The transparent gas barrier biaxially oriented polypropylene film of the present invention has an imperfectly oxidized alumina layer formed on said polyolefin resin layer formed as the surface layer.

In the imperfectly oxidized alumina layer of the present invention, the aluminum metal concentration in the internal portion of the imperfectly oxidized alumina layer must be higher than that in the surface and that in the interface with the polyolefin resin layer, and the aluminum metal content in the imperfectly oxidized alumina layer must be 10 to 200% nm.

In the present invention, the imperfectly oxidized alumina layer refers to a layer mainly composed of aluminum oxide (alumina) and containing metal aluminum not oxidized.

In the present invention, it is especially preferable that the layer containing aluminum metal is distributed only in the internal portion, without being observed in either the surface or the interface with the substrate.

The distribution of aluminum metal can be observed by measuring the aluminum metal concentration in the layer thickness direction, and drawing a depth profile with the position in the thickness direction chosen as the abscissa and the aluminum metal concentration chosen as the ordinate. Aluminum metal can be contained in a plurality of layers, but in view of manufacturing difficulty, it is preferable that aluminum metal is contained in a single layer. The depth profile can be obtained by such a method as Auger electron spectroscopy or X-ray photoelectron spectroscopy.

The internal portion in the present invention refers to a portion excluding the portion (surface) observed without etching and the portion (interface) immediately before the information of carbon atoms in the substrate becomes dominant due to etching, when any of the above surface analysis methods is adopted.

In the present invention, it is important that the metal aluminum content in the imperfectly oxidized alumina layer is 10 to 200% nm. If less than 10% nm, the gas barrier properties may be insufficient, and especially to maintain the gas barrier properties after elongation, 20% nm or more is preferable. If more than 200% nm, the transparency becomes insufficient. More preferable is 100% nm or less.

The reason why the aluminum content is expressed in % nm in the present invention is described below.

If the imperfectly oxidized alumina layer is formed by an ordinary evaporation method, aluminum metal is uniformly dispersed in the layer. So, the aluminum metal concentration can be simply expressed in %. However, to obtain the above mentioned structure characteristic in the present invention, the aluminum metal content must be calculated based on the depth profile, and it is considered that the aluminum metal content is expressed as a peak area, i.e., an integral value. Therefore, the product of the % of the ordinate and the nm of the abscissa is used to express the aluminum metal content, for obtaining an integral value. The average concentration of the layer can be obtained by dividing the value by the layer thickness (nm). However, the inventors thought that the average content of the layer cannot be used to specify the gas barrier properties and transparency intended in the present invention, and adopted the above mentioned aluminum metal content as a parameter in the present invention.

It is preferable in the present invention that the thickness of the imperfectly oxidized alumina layer is 5 to 50 nm. A more preferable range is 8 to 40 nm, and the most preferable range is 10 to 30 nm. If the thickness is too small, gas barrier properties may be insufficient. If the thickness is too large, the gas barrier properties after elongation may be worsened greatly.

It is preferable that the optical transmittance of the transparent gas barrier biaxially oriented polypropylene film of the present invention is in a range of 75 to 90%. A more preferable range is 80 to 88%. If the optical transmittance is too low, transparency becomes poor, and since it becomes difficult to confirm the state of what is contained in the package, the commercial value as a transparent packaging material declines. If the optical transmittance is too high, it is difficult to fulfill the gas barrier properties, and furthermore, the gas barrier properties after elongation are likely to be poor.

It is preferable in view of moisture barrier property that the moisture vapor transmission rate of the transparent gas barrier polypropylene film of the present invention is 2 g/m² day or less.

Furthermore, it is preferable that the moisture vapor transmission rate of the transparent gas barrier biaxially oriented polypropylene film after 2% elongation is 2 g/m² day or less, and more preferable is 1.5 g/m² day or less. Immediately after the imperfectly oxidized alumina layer has been formed, it is more preferable that the moisture vapor transmission rate is smaller, but since the moisture vapor transmission rate rises after processing, the moisture vapor transmission rate after processing into an actual packaging material is important.

The above processing generally refers to printing, lamination and pouch making, and in any case, the film is tensioned and elongated. If the moisture vapor transmission rate after 2% elongation exceeds 2 g/m² day, the moisture barrier property after processing into a packaging material may be insufficient, and the packaging material may be limited in application.

It is preferable that the oxygen transmission rate of the transparent gas barrier polypropylene film of the present invention is 45 cc/m² day or less, since the oxidation of what is contained in the packaging material made by using the film can be prevented.

Furthermore, it is preferable that the oxygen transmission rate of the gas barrier polypropylene film of the present invention after 2% elongation is 45 cc/m² day or less for the same reason as described above for the moisture vapor transmission rate. More preferable is 40 cc/m² day or less.

A laminate film in which a biaxially oriented polypropylene film made of a polypropylene polymer is bonded onto the transparent gas barrier biaxially oriented polypropylene film on the imperfectly oxidized alumina layer side through an adhesive or polyolefin resin can be preferably used as a packaging material. The adhesive used can be any generally sanitarily safe adhesive based on a polyester, polyurethane or polyester/polyurethane, etc. For improving the adhesive strength, the biaxially oriented polypropylene film may be coated for anchoring beforehand. Furthermore, the polyolefin resin used is a resin with a low low melting point such as polyethylene or ethylene-vinyl acetate copolymer. In these cases, the biaxially oriented polypropylene film may be printed beforehand. The laminate film is often processed by a vertical pouch-making machine into pouches, and it is preferable that the biaxially oriented polypropylene film contains an organic slip agent to decrease the worsening of gas barrier properties due to the friction with the pouch-making machine.

It is preferable that the moisture vapor transmission rate of the laminate film of the present invention is 1.5 g/m² day or less, and that even after 2% elongation, the moisture vapor transmission rate is kept.

It is preferable that the oxygen transmission rate of the laminate film of the present invention is 45 cc/m² or less, and that even after 2% elongation, the oxygen transmission rate is kept.

A preferable method for producing the transparent gas barrier biaxially oriented polypropylene film of the present invention is as follows.

The transparent gas barrier biaxially oriented polypropylene film of the present invention can be produced by a method, in which an imperfectly oxidized alumina layer is continuously formed on a polyolefin resin substrate consisting of a base layer mainly composed of a polypropylene polymer and a polyolefin resin layer of 30 to 85 J/g in the heat of fusion formed at least on one side of the base layer, by reactively evaporating metal aluminum with an oxidizing gas, comprising the steps of introducing the oxidizing gas below the substrate with its distance from the substrate kept at ¼ or less of the distance between the evaporation source and the substrate, from the side where the substrate goes into the area for receiving the evaporated aluminum, with the concentration of the oxidizing gas changed in the progression direction of the substrate, to change the concentration of aluminum metal vapor-deposited in the thickness direction of the vapor-deposited layer; and exposing the imperfectly oxidized alumina layer to atmospheric air, for aging.

In the present invention, the method for evaporating metal aluminum is not especially limited, but usually vacuum evaporation is used. For example, metal aluminum loaded in a crucible can he heated and molten to be evaporated by radio-frequency heating, or a wire of aluminum metal can be gradually supplied at a constant rate by motor drive into a boat of boron nitride, etc. cramped at both the ends in the longitudinal direction and resistively heated by electric current, for evaporation. As a further other method, electron beam heating can be used for evaporation.

The oxidizing gas in the present invention refers to a gas containing 50 mol % or more of oxygen, water vapor, ozone, nitrous oxide, etc. or any of their mixtures. If the content is less than 50%, the rate of the gas not consumed by oxidative reaction increases, to raise the pressure in vacuum evaporation, and the uniform formability of the vapor-deposited layer may be adversely affected.

The transparent gas barrier biaxially oriented polypropylene film of the present invention is produced by unwinding a biaxially oriented polypropylene film from a roll as a substrate, continuously evaporating aluminum metal on it, and winding the metallized film as a roll. In this case, the unwinding roll and the winding roll may be placed in a vacuum evaporation chamber, or either of them can be placed in air atmosphere through a proper mechanism to seal vacuum from air, or both of them can be placed in air atmosphere in an air-to-air system.

In the present invention, the method for introducing the oxidizing gas into the portion subject to evaporation is most important. In ordinary reactive evaporation, the oxidizing gas is introduced uniformly into the whole region of the evaporated metal, and the ratio between the metal applied to the substrate and the oxidizing gas is kept constant irrespective of the place. So, the layer obtained is constant in metal concentration in the thickness direction. The inventors found that the transparent gas barrier biaxially polypropylene film obtained by this method cannot stably manifest gas barrier properties, and as a result, completed the present invention.

In the method for producing a transparent gas barrier biaxially oriented polypropylene film of the present invention, it is necessary to introduce the oxidizing gas from the side on which the substrate is guided into the region subject to evaporation (evaporation zone), and to change the concentration of the oxidizing gas in the direction in which the substrate progresses, for changing the concentration of aluminum metal vapor-deposited in the thickness direction of the vapor-deposited layer. The oxidizing gas can be introduced only from the side on which the substrate is guided into the evaporation zone or can be introduced additionally also from the side on which the substrate leaves from the evaporation zone. However, introducing the oxidizing gas only from the side on which the substrate leaves from the evaporation zone cannot be applied in the present invention, since the gas barrier properties are greatly insufficient. It is preferable that the ratio of the amount of the oxidizing gas introduced from the side on which the substrate is guided into the evaporation size to the total amount introduced is 30 to 100%. A more preferable range is 50 to 100%.

When the oxidizing gas is introduced, a more efficient method for making the concentration of the oxidizing gas different in the direction in which the substrate progresses is to keep the distance between the oxidizing gas introducing position and the substrate at not larger than ¼ of the distance between the evaporation source and the substrate in the evaporation zone. If the distance is more than ¼, the oxidizing gas is diffused in the entire evaporation zone, and it is difficult to make the distribution of the oxidizing gas as required in the present invention. A more preferable distance is ⅕ or less.

The metallized film obtained by this method is taken out of the evaporation chamber and exposed to atmospheric air for aging, to achieve high gas barrier properties. That is, the metallized film wound as a roll is rewound or slit when the vapor-deposited surface is exposed to atmospheric air. If the metallized film is left in the evaporation chamber or allowed to stand as a roll still after having been taken out into the atmospheric air, it becomes difficult to achieve the gas barrier properties. It is preferable that the vapor-deposited surface is exposed to atmospheric within 48 hours after evaporation. The atmospheric air in this case refers to ordinary atmospheric air, but for more stable gas barrier properties, it is preferable to control the humidity. Atmospheric air of 40 to 95% RH is preferable. If the humidity is too low, the gas barrier properties may not be stabilized, and if the humidity is too high, the film may have dew condensed, to cause blocking. If the temperature and time for aging are 23° C. and 72 hours or more, or 40° C. and 48 hours or more, or 60° C. and 24 hours or more, sufficient gas barrier properties can be fulfilled.

The above aging can oxidize the aluminum metal on the surface of the imperfectly oxidized alumina layer, to decrease the aluminum metal on the surface. Furthermore, a layer containing aluminum metal can also be formed only in the internal portion, which is a preferable aluminum metal concentration distribution in the present invention.

The mechanism in which the gas barrier properties are improved by aging is not clear, but it can be considered that the imperfectly oxidized alumina layer formed immediately after evaporation is porous and is insufficient in gas barrier properties, but that aging causes oxidation or hydroxidation to be started from the surface and the interface with the substrate, for closing the pores, thereby improving the gas barrier properties. Though the reason is not clear either, it is important for excellent transparecy and gas barrier properties that aluminum metal is distributed ununiformly by the above method beforehand and that aging is effected to keep the aluminum metal concetration in the internal portion larger than that in the surface and that in the interface with the polyolefin resin layer.

The present invention can provide a transparent gas barrier biaxially oriented polypropylene film excellent in transparency, excellent in moisture and oxygen barrier properties and also excellent in the gas barrier properties after elongation.

The polypropylene film can be applied as a packaging material and also after processing, it is excellent in gas barrier properties.

[Methods for evaluation physical properties]

The methods for measuring physical properties in the present invention are as follows.

(1) Heat of Fusion

Thermal analyzing apparatus Model RDC 220 produced by Seiko Instruments was used. Five milligrams of the resin forming the surface layer was loaded into an aluminum pan which was sealed and heated at a rate of 20° C./min. From the area of the heat absorption peak of crystal fusion, the heat of crystal fusion was calculated using a program contained in thermal analyzing system SSC5200 produced by Seiko Instruments. In the case of a mixture consisting of two or more resins to give a plurality of heat absorption peaks, the sum of the respective heat values of crystal fusion was adopted as the heat of crystal fusion.

(2) Aluminum Metal Content (% nm)

Auger electron spectroscope JAMP-10S produced by Nippon Denshi was used. With 3 kV Ar ion etching, a depth profile of Al (metal) and Al (oxide) was prepared by measuring at an acceleration voltage of 3 kV, at a sample current of $5 \times 10^{-8}$ A, at an incident angle of 73.5 degrees and with a beam diameter of 50 µm, correcting in sensitivity and converting into concentration distributions of Al (metal), Al (oxide) and oxygen. From the profile of Al (metal) thus prepared, integration was effected in the thickness direction to obtain the aluminum metal content.

(3) Area Rate of Surface Portions With Gradients of 30 Degrees or More

Atomic force microscope(AFM) Nano Scope II produced by Digital Instruments was used. The surface roughness was observed in a scanning range of 1×1 µm in the topographic mode at a scanning speed of 1.02 Hz. The plane distribution of gradients (absolute values) in the surface was obtained by computer processing, and the area rate of portions of 30 degrees or more was calculated.

(4) Layer Thickness

Transmission electron microscope H-7100FA produced by Hitachi was used. From a sample prepared as a very thin section, a 200,000-fold sectional image was obtained at an acceleration voltage of 100 kV, to measure the thickness of the imperfectly oxidized alumina layer.

(5) Optical Transmittance

Spectrophotometer Model 32B produced by Hitachi was used to measure the transmittance at 550 nm.

(6) Moisture Vapor Transmission Rate

According to ASTM F 124 (JIS K 7129 B method), moisture vapor transmission rate measuring instrument Permatran W3/31 produced by Modern Controls was used to measure at 37.8° C. and 100% RH. The value after 2% elongation was also measured according to the above method after elongating the sample by 2%, keeping for 5 minutes and releasing the tension.

(7) Oxygen Transmission Rate

According to ASTM 3985 (JIS K 7126 B method), oxygen transmission rate measuring instrument Oxtran 2/20 produced by Modern Controls was used to measure at 25° C. and 0% RH. The value after 2% elongation was also measured according to the above method after elongating the sample by 2%, keeping for 5 minutes and releasing the tension.

(8) Wetting Tension

Obtained according to JIS K 6782 method.

(9) Isotatcic Index (II)

A sample was extracted at lower than 60° C. with n-heptane for 2 hours, for removing the materials added to polypropylene. Then, it was dried in vacuum at 130° C. for 2 hours. A sample of W in weight (mg) was taken from it, and put in a Soxhlet extractor, being extracted with boiling n-heptane for 12 hours. The sample was taken out, sufficiently washed with acetone, dried in vacuum at 130° C. for 6 hours and cooled to room temperature. Its weight W' (mg) was measured, and the index was obtained from the following formula:

$$II=(W'/W)\times 100(\%)$$

(10) Mesopentad Fraction

A substrate resin or surface layer resin was dissolved in o-dichlorobenzene, and $^{13}$C-NMR was measured at a resonance frequency of 67.93 MHz using JNM-GX270 produced by JEOL. For assignment of the obtained spectrum and the calculation of mesopentad fraction, based on the method adopted by T. Hayashi et al. (Polymer, 29, 138~143 (1988)), respective peaks were assigned with the mmmmmm peak at 21.855 ppm in the spectrum attributable to the methyl groups, to obtain the peak area, and the ratio of it to the total peak area attributable to the methyl groups was expressed as a percentage. Detailed conditions of measurement were as follows:

Concentration: 15~20 wt %

Solvent: o-dichlorobenzene (90 wt %)/benzene-D6 (10 wt %)

Temperature: 120~130° C.

Resonance frequency: 67.93 MHz

Pulse width: 10 $\mu$sec (45° pulse)

Pulse repetition time: 7.091 seconds

Datum points: 32 K

Integration times: 8168

Measuring mode: Noise decoupling

EXAMPLE 1

As the resin forming the base layer, isotactic polypropylene (iso-PP) (II=97.0%, mesopentad fraction=92%) was used. As the resin forming the surface layer, a blend resin (55 wt % of syn-PP and 45 wt % of iso-PP) consisting of syndiotactic polypropylene (produced by Fina, syndiotacticity 80%) and the same isotactic polypropylene as the resin of the base layer was used. As a slip agent of the resin for the surface layer, 0.1 wt % of crosslinked polymethyl methacrylate particles with a particle size of 2 $\mu$m were added. These resins were supplied into respectively different extruders, melt-extruded at 260° C., filtered by filter assemblies, joined in a nipple, extruded from a slit die, and wound around a metallic drum heated to 40° C., to make a sheet. The sheet was heated to 135° C., stretched to 5 times in the machine direction, cooled, introduced into a tenter oven, heated to 165° C., stretched to 9 times in the transverse direction, heat-treated at 165° C. for 6 seconds while being relaxed by 10% in the transverse direction, exposed to air blow of room temperature, to be cooled to 40° C. at a cooling rate of 50° C./sec., and wound. The total thickness of the film was 18 $\mu$m, and the thickness of the surface layer was 1 $\mu$m. The obtained film was treated on the surface layer side by corona discharge at an intensity of 40 W min/m$^3$ in carbondioxide gas/nitrogen gas (20/80 vol %) atmosphere, to achieve a wetting tension of 45 mN/m.

The method for metallizing the film of the present invention is described below in reference to FIG. 1.

A substrate mainly composed of a polypropylene polymer was loaded in a continuous vacuum evaporator, and was guided around a cooling drum 2 from an unwinding roll 1. Oxygen gas was introduced from an oxygen introducing passage, while metal aluminum 6 was evaporated from an electronic beam heating type evaporation source 4 located at a distance L from the substrate, for forming an imperfectly oxidized alumina layer, and the metallized film was wound around a winding roll 3. The oxygen introducing position 5 in this case was on the unwinding side, and its distance from the substrate was ⅙ of the distance between the evaporation source and the substrate.

The metallized film roll 3 was taken out into the atmospheric air, and in 3 hours after evaporation, it was rewound at a speed of 10 m/min in an atmosphere of 30° C. and 85% RH. It was further aged at 40° C. for 48 hours.

The thickness of the aged imperfectly oxidized alumina layer was 22 nm and the optical transmittance was 82%. As a result of Auger electron spectroscopy, aluminum metal was found to exist only in the internal portion, and the metal aluminum content was 28% nm.

The heat of fusion of the surface layer was 54 J/g, and the rate of surface portions with gradients of 30 degrees or more was 1.8%.

The moisture vapor transmission rate and oxygen transmission rate of the sample, and the moisture vapor transmission rate and oxygen transmission rate after 2% elongation were 1.1 g/m$^2$ day, 39 cc/m$^2$ day, 1.2 g/m$^2$ day and 40 cc/m$^2$ day respectively. The properties of the obtained film are shown in Table 1.

EXAMPLES 2 TO 5

Films were formed as described in Example 1, except that a blend resin consisting of 75 wt % of syn-PP and 25 wt % of iso-PP (Example 2, 42 J/g in the heat of fusion), or an ethylene propylene random copolymer with an ethylene content of 4.3 wt % (Examples 3 and 4, 73 J/g in the heat of fusion), or a low stereoregularity polypropylene resin with a mesopentad fraction of 75% (Example 5, 78 J/g in the heat of fusion) was used as the resin forming the surface layer. An imperfectly oxidized alumina layer was formed on them by evaporation, and the respective metallized films were rewound and aged under the same conditions as in Example 1. In Example 4, the film was gradually cooled at 15° C./sec after the tenter, without being exposed to air blow of room temperature.

The properties of the obtained films are shown in Table 1. All the films of Examples 2 to 5 were 82% in optical transmittance. The film of Example 4 was rather high in the areal rate of surface portions with gradients of 30 degrees or more, and was somewhat poor in gas barrier properties.

EXAMPLES 6 AND 7

Metallized gas barrier biaxially oriented polypropylene films with an aluminum metal content of 13% nm (Example 6) or 113% nm (Example 7) were produced as described in Example 1, using a blend resin consisting of 55 wt % of syn-PP and 45 wt % of iso-PP as the resin forming the surface layer, and except that the amount of the oxygen introduced for evaporation was changed.

The properties of the obtained films are shown in Table 1. The optical transmittance of Example 6 was 87%, and that of Example 7 was 73%. In Example 6, the gas transmission rates after 2% elongation were rather higher. The reason is considered to be that the flexibility was rather low since the aluminum metal content was rather low within the range of the present invention. In Example 7, the gas transmission rates were very low, and the optical transmission was rather as low as 73%.

Comparative Example 1

A metallized gas barrier biaxially oriented polypropylene film was produced as described in Example 1, except that the same isotactic polypropylene resin as the resin used to form the base layer was used as the resin forming the surface layer. The heat of fusion of the surface layer was 105 J/g, and the gas barrier properties were poor.

The properties of the obtained film are shown in Table 1.

Comparative Examples 2 and 3

Films with an aluminum metal content of 8% nm (Comparative Example 2) or 210% nm (Comparative Example 3) were produced as described in Example 1, using a blend resin consisting of 55 wt % of syn-PP and 45 wt % of iso-PP as the resin forming the surface layer and except that the amount of the oxygen introduced for evaporation was changed.

The properties of the obtained films are shown in Table 1. The optical transmittance of Comparative Example 2 was 91%, and that of Comparative Example 3 was 62%. In Comparative Example 2, the gas barrier properties were very poor. In Comparative Example 3, the optical transmittance was 62%, not allowing practical use as a transparent packaging material, though the gas barrier properties were excellent.

Comparative Example 4

The same biaxially oriented polypropylene film using a blend resin consisting of 55 wt % of syn-PP and 45 wt % of iso-PP as the resin forming the surface layer was used as the substrate as in Example 1, and evaporation was coducted as described in Example 1, except that the oxygen introducing position of FIG. 1 was set at ½ of the distance between the evaporation source and the substrate. Then, the film was rewound and aged similarly. In the observation with Auger electron spectroscopy, metal aluminum was found to be distributed in the entire layer, and the gas barrier properties were poor.

The properties of the obtained film are shown in Table 1. The optical transmittance was 78%.

Comparative Example 5

Figure 2:
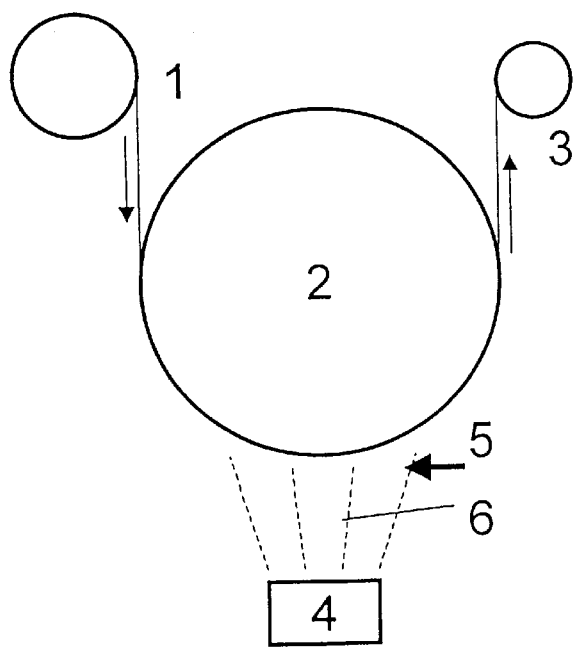
FIG. 2 is a schematic drawing showing the evaporator used in comparative examples. Oxygen is introduced from the side where the substrate is wound.

A biaxially oriented polypropylene film using a blend resin consisting of 55 wt % of syn-PP and 45 wt % of iso-PP as the resin forming the surface layer was used as the substrate as in Example 1, and the oxygen introducing position was set on the winding side for evaporation according to the method shown in FIG. 2. The distance from the substrate was set at ⅙ of the distance between the evaporation source and the substrate. As for the distribution of metal aluminum, the metal aluminum concentration was highest at a portion near the interface with the substrate, and the gas barrier properties were poor.

The properties of the obtained film are shown in Table 1. The optical transmittance was 79%.

Comparative Example 6

Evaporation was conducted as described in Example 1, and immediately after rewinding, the gas barrier properties were measured without aging. As for the distribution of metal aluminum, the metal aluminum content was largest in the surface, and the gas barrier properties were poor.

The properties of the obtained film are shown in Table 1. The optical transmittance was 80%.

TABLE 1

| | Resin of base layer | Resin of surface layer | Heat of fusion (J/g) | Rate of surface portions with gradients of 30 degrees or more (%) | Metal aluminum content (% nm) | Optical transmittance (%) | Gas transmission rate/Gas transmission rate after 2% elongation | | Distribution of metal aluminum |
|---|---|---|---|---|---|---|---|---|---|
| | | | | | | | Moisture vapor (g/m² day) | Oxygen (cc/m² day) | |
| Example 1 | iso-PP | syn-PP(55) + iso-PP(45) | 54 | 1.8 | 28 | 82 | 1.1/1.2 | 39/40 | Existing in internal portion only |
| Example 2 | iso-PP | syn-PP(75) + iso-PP(25) | 42 | 1.2 | 28 | 82 | 0.9/1.0. | 37/39 | Existing in internal portion only |
| Example 3 | iso-PP | EPC (Ethylene content: 4.3 wt %) | 73 | 2.7 | 28 | 82 | 1.2/1.4 | 41/42 | Existing in internal portion only |
| Example 4 | iso-PP | EPC (Ethylene content: 4.3 wt %) | 73 | 4.2 | 28 | 82 | 3.1/3.3 | 60/80 | Existing in internal portion only |
| Example 5 | iso-PP | iso-PP(mmmm = 75%) | 78 | 2.2 | 28 | 82 | 1.8/1.8 | 43/45 | Existing in internal portion only |
| Example 6 | iso-PP | syn-PP(55) + iso-PP(45) | 54 | 1.8 | 13 | 87 | 1.9/2.9 | 48/84 | Existing in internal portion only |
| Example 7 | iso-PP | syn-PP(55) + iso-PP(45) | 52 | 1.8 | 113 | 73 | 0.8/0.9 | 18/20 | Existing in internal portion only |
| Comparative Example 1 | iso-PP | iso-PP | 105 | 10.3 | 28 | 82 | 6.2/6.5 | 180/263 | Existing in internal portion only |
| Comparative Exmaple 2 | iso-PP | syn-PP(55) + iso-PP(45) | 54 | 1.8 | 8 | 91 | 5.5/7.2 | 105/>500 | Existing in internal portion only |
| Comparative Exmaple 3 | iso-PP | syn-PP(55) + iso-PP(45) | 54 | 1.8 | 210 | 62 | 0.8/0.8 | 15/17 | Existing in internal portion only |
| Comparative Exmaple 4 | iso-PP | syn-PP(55) + iso-PP(45) | 54 | 1.8 | 40 | 78 | 4.9/5.2 | 90/110 | Distributed entirely |

TABLE 1-continued

| | Resin of base layer | Resin of surface layer | Heat of fusion (J/g) | Rate of surface portions with gradients of 30 degrees or more (%) | Metal aluminum content (% nm) | Optical transmittance (%) | Gas transmission rate/Gas transmission rate after 2% elongation | | Distribution of metal aluminum |
|---|---|---|---|---|---|---|---|---|---|
| | | | | | | | Moisture vapor (g/m² day) | Oxygen (cc/m² day) | |
| Comparative Exmaple 5 | iso-PP | syn-PP(55) + iso-PP(45) | 54 | 1.8 | 38 | 79 | 3.7/4.5 | 120/180 | Largest at the interface with substrate |
| Comapraqtive Example 6 | iso-PP | syn-PP(55) + iso-pp(45) | 52 | 1.8 | 35 | 80 | 7.1/7.3 | 230/290 | Largest in surface |

EXAMPLE 8

As the resin forming the base layer, iso-PP (II=97.0%, mesopentad fraction=92%) was used. As the resin forming the surface layer, a blend resin (55 wt % of syn-PP and 45 wt % of iso-PP) consisting of syn-PP (produced by Fina, syndiotacticity 80%) and the same isotatic polypropylene as the resin forming the base layer was used. Furthermore, as the resin forming a heat seal layer, an ethylene propylene butene terpolymer (containing 1.5 wt % of ethylene and 14 wt % of butene) was used. As a slip agent for the resin forming the surface layer, 0.1 wt % of crosslinked polymethyl methacrylate particles with a particle size of 2 μm were added. As a slip agent for the heat seal layer, crosslinked silicone particles with a particle size of 3.5 μm were added. These resins were supplied into respectively different extruders, melt-extruded at 260° C., filtered by filter assemblies, joined in a nipple, extruded from a slit die, and wound around a metallic drum heated at 40° C., to make a sheet. The sheet was heated to 135° C., stretched to 5 times in the machine direction, cooled, introduced into a tenter oven, heated to 165° C., stretched to 9 times in the transverse direction, heat-treated at 165° C. for 6 seconds while being relaxed by 10% in the transverse direction, and exposed to air blow of room temperature, to be cooled at a cooling rate of 50° C./sec to 40° C., and wound. The total thickness of the film was 18 μm, and the thickness of the surface layer was 1 μm. The thickness of the heat seal layer was 2 μm. The obtained film was treated on the surface layer side by corona discharge at an intensity of 40 W min/m² in carbondioxide acid gas/nitrogen gas (20/80 vol %) atmosphere, to achieve a wetting tension of 45 mN/m.

Subsequently as described in Example, evaporation, rewinding and aging were conducted to obtain a sample. The sample was the same as that of Example 1 in the heat of fusion of the resin forming the surface layer, the rate of surface portions with gradients of 30 degrees or more and the metal aluminum content. The moisture vapor transmission rate and the oxygen transmission rate after 2% elongation were 1.3 g/m² day and 42 cc/m² day respectively. Thus, a packaging film with excellent gas barrier properties and heat sealability could be obtained.

EXAMPLE 9

A 20 μm thick single-layer biaxially oriented isotatic polypropylene film was obtained as described in Example 1, except that isotactic polypropylene (II=97.0%, mesopentad fraction=92%) was used, that 0.1 part of stearic acid amide as an organic slip agent and 0.1 part of crosslinked silicone particles as an anti-blocking agent were added per 100 parts of polypropylene, and that the surface layer of Example 1 was not formed. The polypropylene film was coated, on the corona discharge treated side, with a polyester/polyurethane adhesive using a reverse coater, to achieve a layer thickness of 5 μm after drying the solvent, and dried at 90° C. in a drying oven. It was overlaid on the gas barrier biaxially oriented polypropylene film obtained in Example 8 on its imperfectly oxidized alumina side, and the laminate was bonded by pressure contact using a press roll heated at 80° C. The moisture vapor transmission rate and oxygen transmission rate of the laminate film were 1.2 g/m² day and 34 cc/m² day respectively. The lamination did not greatly lower the gas barrier properties. The moisture vapor transmission rate and oxygen transmission rate after 2% elongation of the laminate were 1.3 g/m² day and 36 cc/m² day respectively, showing that good gas barrier properties were kept.

EXAMPLE 10

The same 20 μm thick biaxially oriented isotatic polypropylene film as used in Example 9 was coated, on the corona discharge treated side, with an urethane anchor coating material. Molten 310° C. low density polyethylene was laminated to have a thickness of 20 μm through a slit die into the clearance between the anchor coating face of said biaxially oriented polypropylene film and the imperfectly oxidized alumina face of the gas barrier biaxially oriented polypropylene film obtained in Example 8, and the laminate was bonded by pressure contact using a cooling roll. The moisture vapor transmission rate and oxygen transmission rate of the laminate film were 1.4 g/m² day and 36 cc/g² day respectively. The lamination did not lower the gas barrier properties. The moisture vapor transmission rate and oxygen transmission rate after 2% elongation of the laminate were 1.5 g/m² day and 42 cc/m² day respectively, showing that good gas barrier properties could be kept.

What is claimed is:

1. A transparent gas barrier biaxially oriented polypropylene film, comprising:
    1) a base layer comprising a polypropylene polymer
    2) a polyolefin resin layer of 30 to 85 J/g in the heat of fusion formed at least on one side of the base layer, and
    3) an imperfectly oxidized alumina layer formed on the polyolefin resin layer, wherein the aluminum metal concentration in the internal portion of the imperfectly oxidized alumina layer is higher than that in the surface of the layer and that in the interface with the polyolefin resin layer, and the aluminum metal content in the imperfectly oxidized alumina layer is kept in a range of 10 to 200% nm.

2. The transparent gas barrier biaxially oriented polypropylene film, according to claim 1, wherein the imperfectly oxidized alumina layer contains aluminum metal only in its internal portion.

3. The transparent gas barrier biaxially oriented polypropylene film, according to claim 1, wherein the polyolefin resin layer is 3% or less in the areal rate of surface portions with gradients of 30 degrees or more, on the surface provided with the imperfectly oxidized alumina layer.

4. The transparent gas barrier biaxially oriented polypropylene film, according to claim 1, wherein a heat seal layer is formed on the side opposite to the side with the imperfectly oxidized alumina layer formed.

5. The transparent gas barrier biaxially oriented polypropylene film, according to any one of claims 1 through 4, wherein the moisture vapor transmission rate is 2 $g/m^2$ day or less and the oxygen transmission rate is 45 $cc/m^2$ day or less.

6. The transparent gas barrier biaxially oriented polypropylene film, according to claim 5, wherein the moisture vapor transmission rate after 2% elongation is 2 $g/m^2$ day or less and the oxygen transmission rate after 2 $g/m^2$ day or less and the oxygen transmission rate after 2% elongation is 45 $cc/m^2$ day or less.

7. The transparent gas barrier biaxially oriented polypropylene film, according to any one of claims 1 through 4, wherein the optical transmittance is 75 to 90%.

8. The laminate film comprising a biaxially oriented polypropylene film composed of a polypropylene polymer, being bonded on the transparent gas barrier biaxially oriented polypropylene film stated in any one of claims 1 through 4, on the imperfectly oxidized alumina layer side, through an adhesive or polyolefin resin.

9. The laminate film according to claim 8, wherein the moisture vapor transmission rate is 1.5 $g/m^2$ or less and the oxygen transmission rate is 45 $cc/m^2$ day or less.

10. The laminate film according to claim 9, wherein the moisture vapor transmission rate after 2% elongation is 1.5 $g/m^2$ day or less and the oxygen transmission rate after 2% elongation is 45 $cc/m^2$ day or less.

11. A method for producing a transparent gas barrier biaxially oriented polypropylene film, in which an imperfectly oxidized alumina layer is continuously formed on a polyolefin resin substrate consisting of 1) a base layer comprising a polypropylene polymer and 2) a polyolefin resin layer of 30 to 85 J/g in the heat of fusion formed at least on one side of the base layer, by reactively evaporating metal aluminum with an oxidizing gas, comprising the steps of introducing the oxidizing gas below the substrate with its distance from the substrate kept at ¼ or less of the distance between the evaporation source and the substrate, from the side where the substrate goes into the area for receiving the evaporated aluminum, with the concentration of the oxidizing gas changed in the progression direction of the substrate, to change the concentration of aluminum metal vapor-deposited in the thickness direction of the vapor-deposited layer; and exposing the imperfectly oxidized alumina layer to atmospheric air, for aging.

* * * * *